United States Patent [19]
Fasano et al.

[11] Patent Number: 6,086,383
[45] Date of Patent: Jul. 11, 2000

[54] COAXIAL INTERCONNECT DEVICES AND METHODS OF MAKING THE SAME

[75] Inventors: Benjamin V. Fasano, New Windsor; Kevin M. Prettyman, Holmes, both of N.Y.

[73] Assignee: International Business Machines Corporation, Armonk, N.Y.

[21] Appl. No.: 09/103,971

[22] Filed: Jun. 24, 1998

Related U.S. Application Data

[63] Continuation of application No. 08/739,104, Oct. 25, 1996, Pat. No. 5,791,911.

[51] Int. Cl.⁷ .................................................. H01R 12/00
[52] U.S. Cl. ................................................................ 439/63
[58] Field of Search .............................. 439/63, 581, 675, 439/76.1

[56] References Cited

U.S. PATENT DOCUMENTS

| | | | |
|---|---|---|---|
| 3,148,356 | 9/1964 | Hedden | 439/931.1 |
| 3,551,874 | 12/1970 | Volinskie | 439/76.1 |
| 4,593,464 | 6/1986 | Williams | 439/675 |
| 4,603,926 | 8/1986 | Nesbit et al. | 439/63 |
| 4,734,046 | 3/1988 | McAllister et al. | 439/101 |
| 4,771,294 | 9/1988 | Wasilousky | 333/245 |
| 4,819,131 | 4/1989 | Watari | 439/65 |
| 5,046,966 | 9/1991 | Snyder et al. | 439/63 |
| 5,120,258 | 6/1992 | Carlton | 439/63 |
| 5,145,382 | 9/1992 | Dickirson | 439/63 |
| 5,222,014 | 6/1993 | Lin | 361/414 |
| 5,266,912 | 11/1993 | Kledzik | 439/65 |
| 5,323,533 | 6/1994 | Val | 29/840 |
| 5,400,003 | 3/1995 | Kledzik | 333/247 |
| 5,400,504 | 3/1995 | Neumann et al. | 29/883 |
| 5,612,657 | 3/1997 | Kledzik | 333/247 |
| 5,691,041 | 11/1997 | Frankeny et al. | 428/209 |

FOREIGN PATENT DOCUMENTS 2-94693  9/1988  Japan .

OTHER PUBLICATIONS

"Coaxial Connector", IBM Technical Disclosure Bulletin, vol. 21, No. 10, Mar., 1979.

"Coaxial Complaint Pin Electrical Connector", IBM Technical Disclosure Bulletin, vol. 32, No. 11, Apr. 1990.

"Printed Circuit Net Repair Utilizing A Coaxial Cable–To–Board Pin Connection", IBM Technical Disclosure Bulletin, vol. 33, No. 1B, Jun. 1990.

"Ceramic Ball Grid Array Packaging", Advanced Microelectronics, Jan./Feb. 1995.

*Primary Examiner*—Renee Luebke
*Assistant Examiner*—T C Patel
*Attorney, Agent, or Firm*—DeLio & Peterson, LLC; Robert Curcio; Aziz M. Ahsan

[57] ABSTRACT

A surface mounted electronic interconnect device. The device includes a coaxial electrical pad comprising a plurality of conductive surfaces on a substrate corresponding to the conductor arrangement of a coaxial connector; and, a coaxial connector comprising a dielectric material having a center opening and isolated electrically conductive interior and exterior surfaces that are planar with the ends of the connector. The dielectric separates the inner conductive surface from the outer conductive surface and is tubularly shaped having an inner wall for the electrically conductive interior surface. The coaxial connector inner and outer conductors may alternatively be comprised of microsprings. The coaxial connector has first and second ends, the first end for attachment to an electronic package and the second end for pluggable attachment to a PC board. A socket for mating with the coaxial connector second end is demonstrated, comprising a body and inner and outer conductors and configured so as to contact the interior and exterior surfaces of the coaxial connector at different times. The inner conductor of the socket is adapted to be received within the electrically conductive interior surface of the coaxial connector.

2 Claims, 13 Drawing Sheets

COAXIAL INTERCONNECT DEVICES AND METHODS OF MAKING THE SAME

This is a continuation of application Ser. No. 08/739,104, filed on Oct. 25, 1996, now U.S. Pat. No. 5,791,911.

BACKGROUND OF THE INVENTION

1. Field of the Invention

The present invention relates to coaxial connectors and, in particular, to coaxial connectors used for connecting single chip and multichip modules to each other and to printed circuit boards.

2. Description of Related Art

In surface mount technology, integrated circuits (ICs) are connected to ceramic or organic packages which in turn have metal leads extending therefrom for connection to a printed circuit (PC) board by means of soldering or by insertion into a socket. The electrical attachment of the IC to the package is often referred to as the first level of attachment. The electrical attachment of the package to the PC board is the second level of attachment. The trend for IC packages is to increase the density and number of ICs on a package with a resultant increase in the number of Input/Output (I/O) connections at the second level of attachment.

The density of the second level attach for high IO counts is currently being satisfied by several types of attachment schemes including Pin Grid Arrays (PGAs), Ball Grid Arrays (BGAs) and Column Grid Arrays (CGAs).

The PGA consists of an array of metal pins which are typically 100 to 200 mils long and are plated with gold to improve resistance to oxidation. The PGA is attached to circular conductive or metallized pads on the package. Attachment is typically by soldering or brazing to the metallized pads arranged on the package surface surrounding the ICs or on the opposite side of the package from the ICs. The metallized pads are electrically connected to internal conductors or vias which are used to provide wiring for the ICs. The PGA connection method has been used for many years and allows the IC and package to be tested or burned-in prior to installation in a product since the pins can be socketed and tested easily and with minimal disruption of the structure of the package. The long pins also help to absorb the difference in Coefficient of Thermal Expansion (CTE) between the package and the circuit board. A large CTE mismatch can cause failure of the solder at the package to pin location. Long lead lengths help to minimize the lateral movement of the pins at the solder joints. The pad diameter required to provide a reliable solder attach of the pins consumes a large amount of surface area on the package making an increase in the IO density of the second level attach difficult. Typical IO pitch between the pins is about 100 mils. In addition, the long pin lead lengths contribute greatly to an unwanted inductance between adjacent pins which causes considerable degradation of electrical performance. In order to help minimize crosstalk, traditional wiring schemes surround signal conducting pins with ground or voltage pins that can help to isolate the pins. The isolation schemes cause further loss in IO density and performance. Additionally, off chip frequencies are increasing into the GHz range demanding greater isolation of the signal conductors from unwanted crosstalk.

Another second level attach method is the Ball Grid Array (BGA). The BGA uses a pad attach scheme similar to the PGA except, instead of a metal pin, a high temperature solder ball is attached to the pad using a lower temperature solder. The resultant ball grid array provides a higher density of IO with a typical pitch of 40 to 50 mils. The shorter height of the balls, typically 35 mils, greatly decreases the contribution of the interconnection length to unwanted inductance. However, the shorter ball height makes the BGAs poor candidates for a pluggable burn-in test or for a pluggable package for system use and field upgrades because the balls are made of soft solder specifically for ease of attachment and absorption of stresses of CTE mismatch between the package and the board. The soft solder of the BGA deforms easily and can permit contact degradation over repeated thermal cycles. Another drawback of the BGA is the short height of the balls which have little resistance to solder fatigue caused by numerous thermal cycles. Resistance to fatigue is important to packages of larger size since the IO connections at the greatest distance from the center of the packages, usually the corners, are the most likely to fail. A compromise solution to this problem has been the introduction of the Column Grid Array (CGA) package. Again, an array of pads are connected to a higher joining temperature solder, this time in the form of a column or wire, by a lower joining temperature solder. The pitch of a CGA connection can be the same as a BGA. The columns provide a higher degree of reliability compared to the BGA due to their longer lengths. However, the columns are not easily pluggable for burn-in or system or field upgrades. In addition, the solder columns are very easily damaged in processing and handling and must be protected at all times.

One approach to the signal isolation problem is U.S. Pat. No. 5,266,912 which describes a coaxial connector which requires a through-hole in the substrate which takes up surface area on both sides of the substrate. The device has less than desired attachment flexibility because there is no opportunity to reset the grid during attachment of the pins in the coaxial connectors. Resetting the grid would assure that the pins are properly spaced after connection. Also, there is no mechanism for a wiping action between the pin and the socket of the mating coaxial connector which would increase the reliability of the pluggable connection.

An ideal second level connection scheme would allow high density IO, pluggable burn-in, pluggable field replacement, low inductance, high signal isolation and high reliability.

Bearing in mind the problems and deficiencies of the prior art, it is therefore an object of the present invention to provide an electronic interconnect device which is compliant in the XY axis thereby allowing for insertion into a socket while being tolerant of socket to package movement during thermal cycling due to CTE mismatch.

A further object of the invention is to provide a coaxial connector attachment scheme by which an array of compliant connectors arranged on a package can be aligned during insertion into a socket which can also be used to carry voltage or ground.

It is yet another object of the present invention to provide a compliant array of connectors which can be mass produced.

It is yet another object of the present invention to provide a compliant array of electronic interconnect devices which are suitable for high frequency applications.

It is yet another object of the present invention to provide an electronic interconnect device array which can be plugged into a test socket and system board for burn-in and assembly.

It is yet another object of the present invention to provide a coaxial connector with high IO density.

Still other objects and advantages will in part be obvious and will in part be apparent from the specification.

SUMMARY OF THE INVENTION

The above and other objects, which will be apparent to those skilled in the art, are achieved by the present invention which in a first aspect relates to a method of making an electronic interconnect device, comprising the steps of: a) providing a coaxial connector comprising a dielectric material having a center opening and isolated electrically conductive interior and exterior surfaces, said coaxial connector having first and second ends; b) providing an electronic substrate having coaxial electrical pads attached thereon; c) positioning said coaxial connector on said coaxial electrical pads and attaching said coaxial connector first end to said pads on said substrate; d) providing a socket attached to a PC board, said socket comprising a body and inner and outer conductors housed in said body and configured for mating with said coaxial connector, said inner and outer conductors configured so as to respectively contact said interior and exterior surfaces of said coaxial connector at different times in order to reduce the maximum insertion force of said coaxial connector into said socket; and e) connecting said coaxial connector second end to said socket.

In another aspect, the present invention relates to a method of making an electronic package, comprising the steps of: providing a trilayer dielectric sheet with an inner layer and two outer layers, said outer layers comprising a material which is more easily removable than said inner layer; b) forming a hole in said trilayer dielectric sheet; c) providing an outer conductor with an outside diameter approximately equal to the inside diameter of the hole in said trilayer dielectric sheet, said outer conductor axially aligned with said hole; d) providing a filler dielectric with removability similar to said inner layer of said trilayer dielectric sheet; e) filling said outer conductor with said filler dielectric; f) forming a hole in said filler dielectric, said hole axially aligned with said outer conductor; g) providing an inner conductor with an outside diameter approximately equal to the inside diameter of the hole in said filler dielectric; and h) removing said outer layers of said trilayer dielectric substrate such that said coaxial connector protrudes from the inner layer of said trilayer dielectric substrate.

In another aspect, the present invention relates to a method of making an electronic interconnect device, comprising the steps of: a) providing a dielectric sheet with first and second surfaces; b) forming a hole in said dielectric sheet; c) providing an outer conductor with an outside diameter approximately equal to the inside diameter of the hole in said dielectric sheet, said outer conductor axially aligned with said hole; d) providing a filler dielectric with removability similar to the removability of said dielectric sheet; e) filling said outer conductor with said filler dielectric; f) forming a hole in said filler dielectric, said hole axially aligned with said outer conductor; g) providing an inner conductor with an outside diameter approximately equal to the inside diameter of the hole in said filler dielectric; h) filling said inner conductor with said filler dielectric; and i) removing said first and second surfaces of said dielectric substrate such that said inner and outer conductors are exposed and protrude from said dielectric sheet.

In another aspect, the present invention relates a coaxial electrical pad for an electronic interconnect device. The pad comprises a plurality of conductive surfaces attached to a substrate in a configuration which corresponds to the conductor arrangement of a coaxial connector whereby mechanical connection of said coaxial connector to said substrate can be made.

In another aspect, the present invention relates to an electronic interconnect device. The device comprises a coaxial connector comprising a dielectric material having a center opening and electrically conductive interior and exterior surfaces. The coaxial connector has first and second ends. The first end is for attachment to an electronic package.

In another aspect, the present invention relates to an electronic interconnect device. The device comprises a coaxial connector comprising a dielectric material having a center opening and isolated electrically conductive interior and exterior surfaces. The coaxial connector has first and second ends. The first end for attachment to a PC Board.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
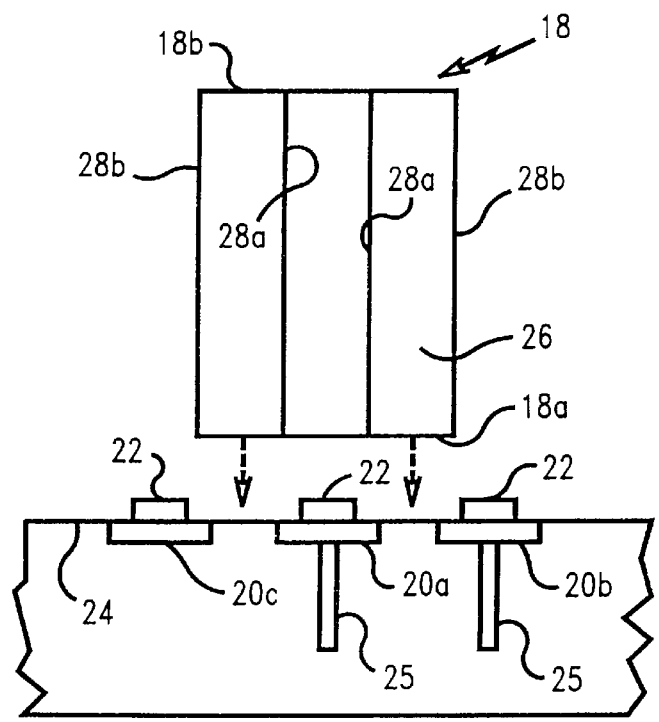
FIG. 1a is a cross-sectional view of a coaxial connector with a hollow insulating cylinder and isolated electrically conductive interior and exterior surfaces.

In describing the preferred embodiment of the present invention, reference will be made herein to FIGS. 1–7 of the drawings in which like numerals refer to like features of the invention. Features of the invention are not necessarily shown to scale in the drawings.

FIG. 1a illustrates a coaxial connector 18 comprising an insulating tube 26, preferably of a polymer material, with electrically isolated inner and outer conductors 28a,b. The connector 18 is positioned above and aligned for attachment to an IC package or electronic substrate 24 at a first end 18a such as a multichip module (MCM) or a single chip module (SCM). Positioned on substrate 24 and aligned for attachment to the inner and outer conductors 28a,b are coaxial electrical pads 20 which are described below. Solder paste or preformed solder 22 is positioned on each electrical pad 20. In all embodiments, electrical connection of the electrical pads 20 to electrically conductive vias 25 in the substrate 24 is dependent upon the application.

Figure 1B:
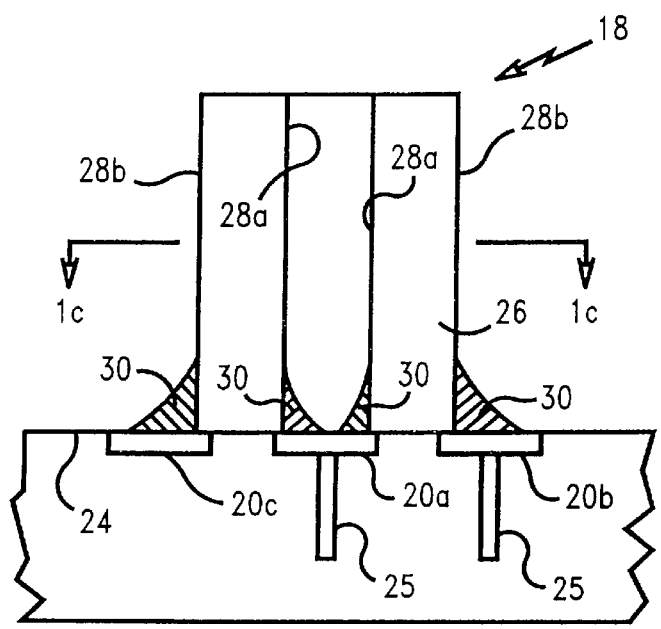
FIG. 1b is a cross-sectional view of the coaxial connector of FIG. 1a attached to an electronic substrate with corresponding coaxial electrical pads on the surface of the substrate.

FIG. 1b illustrates the electrical connection of pads 20a,b to vias 25 and the mechanical connection of pad 20c to connector 18 by solder fillet 30. While the attachment can be made by solder, as shown, it may also be made by an electrically conductive epoxy. Preferably, a wetted fillet from a solder reflow is formed. The coaxial connectors 18 can be attached using a fixture which holds the connectors in alignment with the IO pads on the substrate 24 during solder joining. The fixture maintains the proper spacing and alignment of the pins for the next level of connection and minimizes the effects of individual IO pad movement from the proper positions.

Figure 1C:
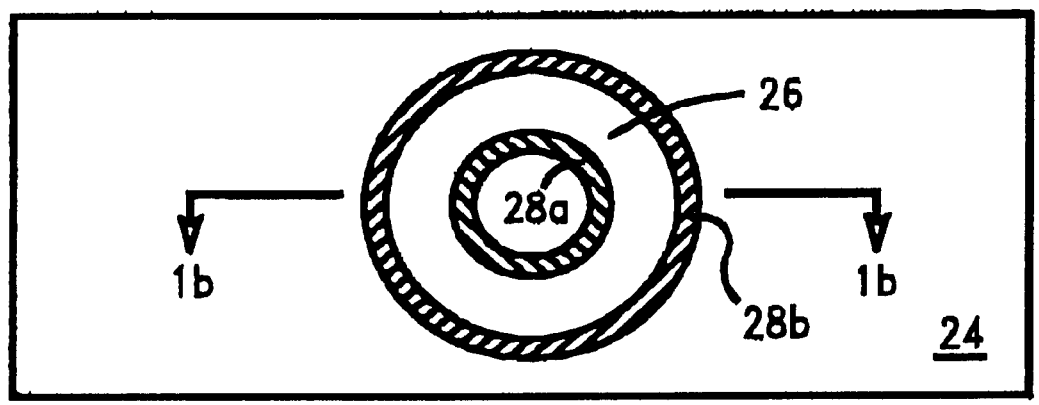
FIG. 1c is a top view along line 1c—1c of FIG. 1b illustrating the conductor layering of the coaxial connector.

FIG. 1c illustrates a top view along line 1c—1c of FIG. 1b illustrating the conductor layering and the shape of the coaxial connector 18. The tubularly shaped connector 18 comprises a tubularly shaped dielectric 26 with conductive inner and outer walls 28a,b. In instances where a single circular pad is used for the outer conductor, pads 20b,c will be connected. A second end 18b of the coaxial connector may be received by a socket as described below. The connector may alternately be attached to a Printed Circuit (PC) board.

Figure 2B:
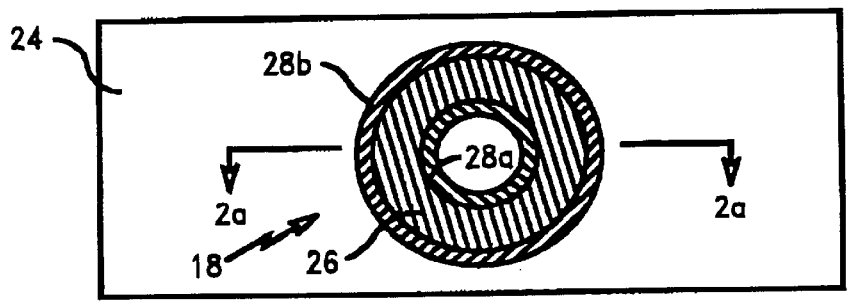
FIG. 2b is a top view of the coaxial connector of FIG. 2a along line 2b—2b illustrating the continuous outer conductor.
Figure 2A:
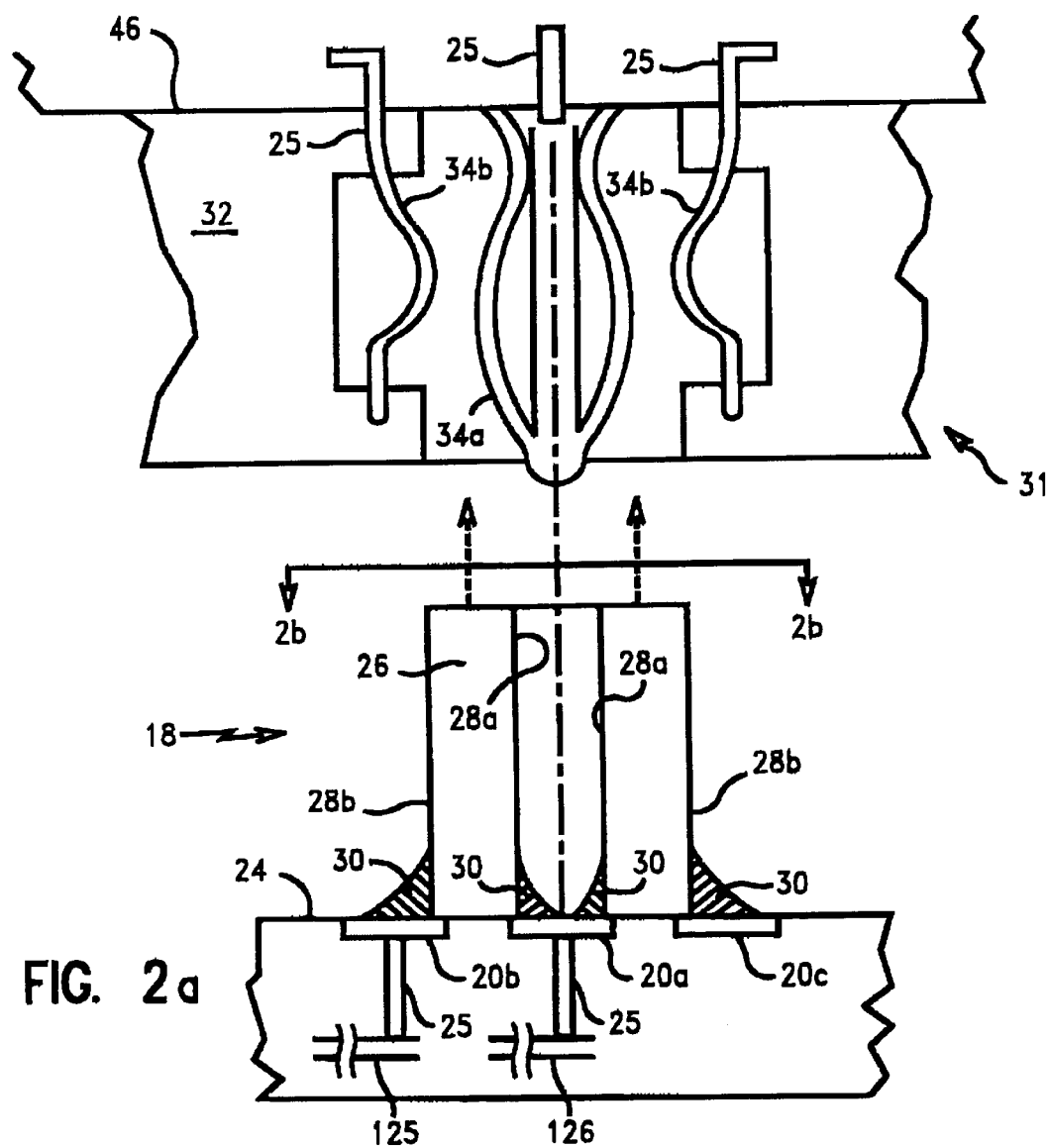
FIG. 2a is a cross-sectional view of the coaxial connector of FIG. 1b illustrating the alignment for attachment to a socket array and the stepped height of socket inner and outer connectors.
Figure 2C:
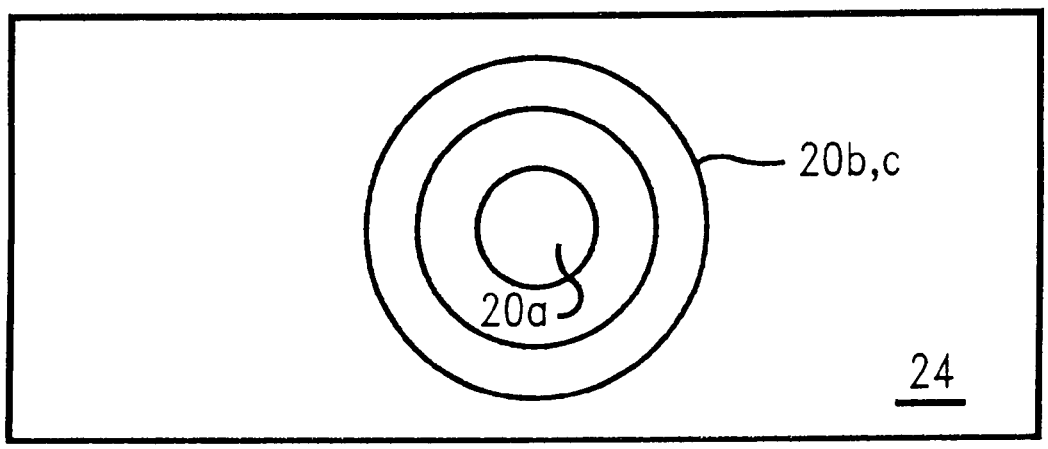
FIG. 2c is a top view of the substrate without the coaxial connector attached, illustrating the IO pad configuration on the substrate.

FIGS. 2a–b illustrate a coaxial connector similar to the connector of FIG. 1b attached by fillets to the center electrical pad 20a and outer electrical pad 20b. Outer electrical pad 20c is not electrically connected to the wiring 125,126 within the substrate 24; however, electrical connection to a via 25 is possible if desired for a particular application. Electrical pads 20a,b are connected to vias 25 in the substrate 24. The continuous outer conductor 28b, illustrated in FIG. 2b, is suitable for shielding the center conductor in high frequency applications. FIG. 2c is a top view of the substrate 24 without the coaxial connector 18 attached, illustrating the IO pad 20a,b,c configuration on the substrate 24.

Coaxial electrical pads 28a,b are electrical connection devices made of conductive or metallized surfaces which are attached to the exterior of a substrate 24. The pads are positioned for mechanical attachment of the coaxial connector to the substrate, by solder, epoxy or the like, and may be electrically connected to vias in the substrate. Inner and outer electrical pads 20a,b,c are illustrated in FIG. 2c. The outer electrical pad 20b,c may be configured to correspond to the outer conductor arrangement of the coaxial connector.

FIG. 2a also illustrates a socket 31 for the coaxial connector. The socket 31 is suitable for use with various embodiments hereinafter described except for the embodiment of FIG. 3a which requires socket modification to accommodate a plurality of outer conductors of the coaxial connector. The socket 31 comprises a body 32 and inner and outer conductors 34a,b housed in the body 32 and configured for mating with the coaxial connector. The inner and outer conductors 34a,b are electrically connected, for example, to a PC board 46 by vias 25. The inner and outer conductors 34a,b are configured so as to respectively contact the interior and exterior surfaces 28a,b of the coaxial connector 18 at different times in order to reduce the maximum insertion force of the coaxial connector 18 into the socket 31. The configuration of the socket conductors 34a,b also assists in the removal of oxides from the coaxial conductors 28a,b as the connection is being made. The insertion wipe is further described below. The socket is typically attached to a PC board although other applications may be suitable including adding a socket to a substrate.

The coaxial connector can be made by various methods. A first method begins with a commercially available ceramic tube which is typically manufactured using an extrusion process in order to create an extremely long tube. The interior and exterior of the tube are subsequently plated using, for example, an electroless plating metallization process or a seed plating metallization process. These processes can be performed by one of ordinary skill in the art without undue experimentation. Following plating, the tube can be cut by laser, abrasive sawing or the like, to form lengths of coaxial tubing with nonconductive ends.

Alternately, the coaxial connectors may be made using polymer tubes which can be plated or coated with electrically conductive material and which can then be appropriately attached to the coaxial electrical pads 20 on the substrate 24. Polymer tubes, preferably of polyimide suitable for making coaxial conductors, are available from HV Technologies, Inc. of Trenton, Ga. Appropriate tube outside diameters range from about 0.8 mm to 2.0 mm (20–50 mils), with preferred outside diameter being from about 1.2 mm to 1.6 mm (30–40 mils) and wall thicknesses ranging from about 0.1 mm to 0.3 mm (3–8 mils), with preferred wall thickness being from about 0.1 mm to 0.2 mm (4–6 mils).

The length of the connector 18 for each embodiment should be in the range from about 1.2 mm (30 mils) to 7.9 mm (200 mils) so as to provide for sufficient mating of the connector 18 to the socket 31 in order to hold the connection in place. The connector length also allows for a long insertion wipe or rub length for mating with the socket conductors. The insertion wipe should be at least 0.2 mm (0.5 mils) and more typically 0.2 mm to 0.8 mm (5 mils to 20 mils). The long wipe facilitates the removal of oxides which form on the conductive material and which can interfere with the electrical connection and reliability.

There are a number of ways to accomplish the attachment of a discrete coaxial connector to a package. When connectors have been previously cut to the length desired, each connector can be loaded into a fixture (not shown) that will hold the connectors in a desired pattern with the ends positioned so as to allow alignment of the ends to the IO pads on the substrate. The array of connectors can then be processed through, for example, a solder reflow oven to join the connectors to the substrate IO pads in a batch operation. This batch process is similar to that of a pin attach process for PGA package manufacturing and can be performed by one of ordinary skill in the art without undue experimentation.

Alternately, long lengths of surface metallization polymer tubes can be inserted into a loading configuration that feeds the tubes into a coaxial connector attachment fixture. Thereafter, a knife or cutting operation could be used to cut off the desired length of the connector allowing it to be deposited into the attachment fixture. Thereafter, the fixture with the array of connectors can be aligned with the IO pads on the substrate and used to join all the connectors in a joining operation.

In the attachment methods described, the fixture maintains the proper spacing and alignment of the pins for the next level of connection and minimizes the effects of individual IO pad movement from the proper positions.

Polymer coaxial connectors have advantages over PGA and CGA packages including compliance which allows insertion misalignment, as well as, the ability to function when a CTE (Coefficient of Thermal Expansion) mismatch is present between the PC board 46 and the substrate 24.

Alternately, for lower frequency applications, where a skin depth effect is not important, the use of an anodized aluminum tube to form an insulating layer is appropriate. The anodized layer forms an insulating surface, thereafter, the anodized surfaces could be plated using an electroless nickel gold plating and seeding methods, to form a conductive surface on both sides of the insulating anodization. These processes can be performed by one of ordinary skill in the art without undue experimentation.

FIGS. 3a–d illustrate an application wherein the connector 18 has two electrically isolated outer conductors 28b', 28b". While only two isolated outer conductors 28b', 28b" are illustrated, a plurality of electrically isolated outer conductors may be used. The outer conductors are especially suitable for a variety of connections such as signal, voltage or grounding made in low frequency applications where complete coaxial shielding of the inner conductor is not necessary. Outer electrical pad 20c is not electrically connected to the substrate 24, however electrical connection to a via 25 is possible if desired for a particular application. Electrical pads 20a,b are connected to vias 25 in the substrate 24.

A socket similar to that of FIG. 2a is appropriate for the embodiment of FIG. 3. However, the socket outer conductor 34b' and 34b" should be arranged to accommodate the configuration of the coaxial connector outer conductors 28b' and 28b" in order to connect to a plurality of electrically isolated coaxial outer conductors. In FIG. 3a, outer coaxial conductors 28b',b" are aligned with outer socket conductors 34b',b".

Figure 3B:
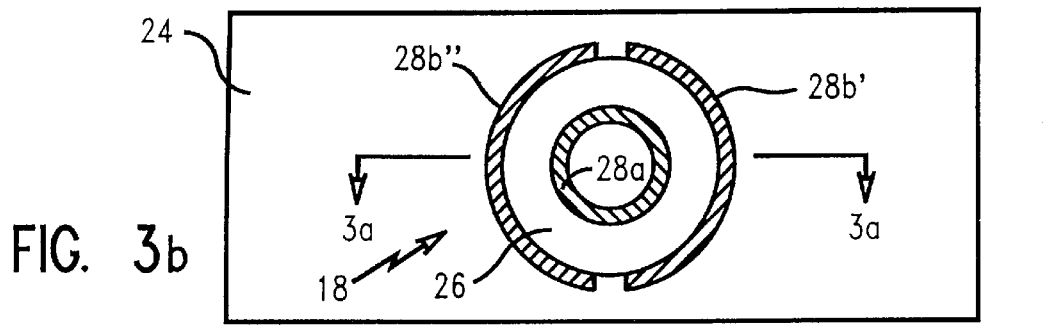
FIG. 3b is a top view of the coaxial connector of FIG. 3a illustrating the electrically isolated outer conductors.
Figure 3A:
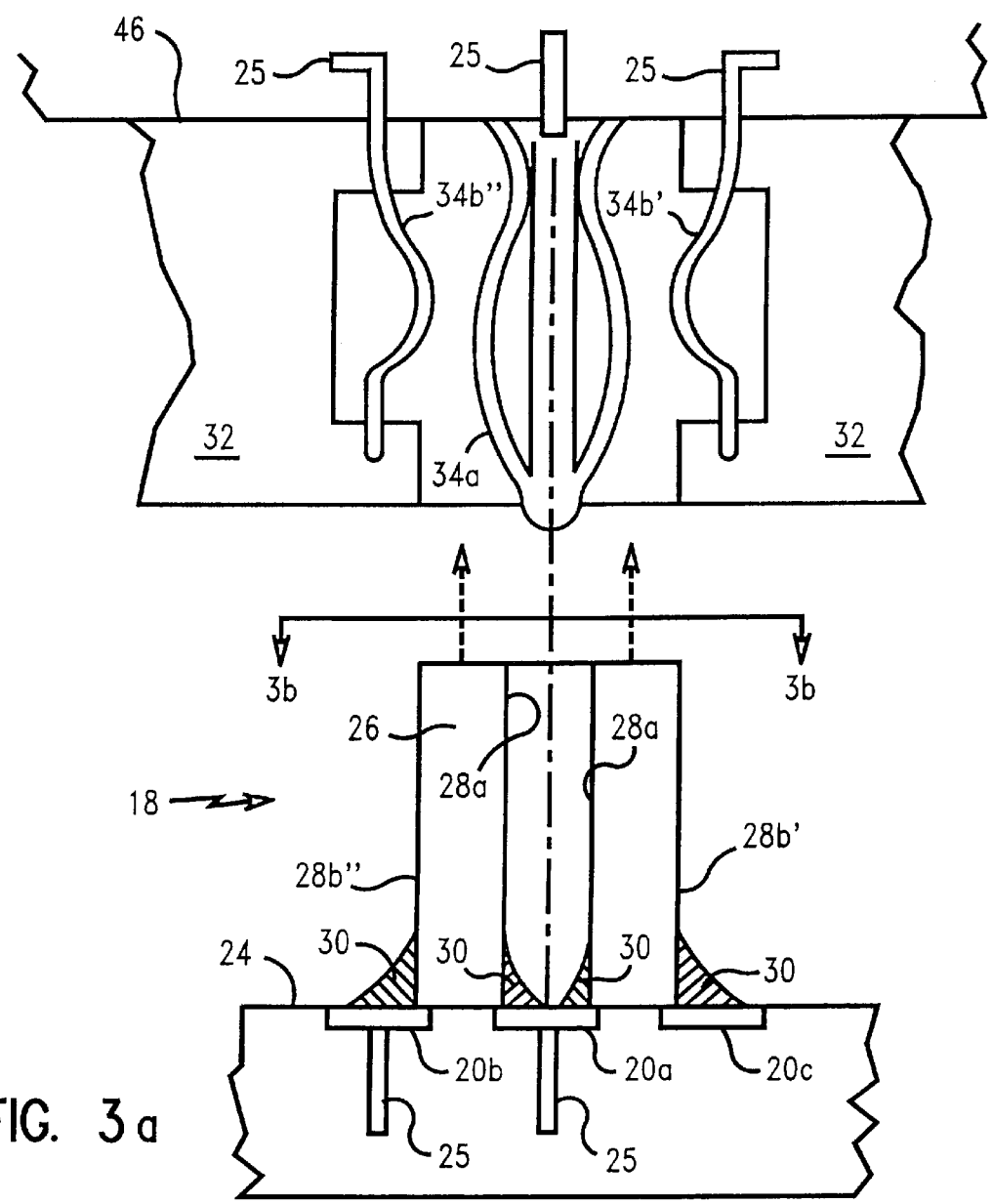
FIG. 3a is a cross-sectional view of a coaxial connector with electrically isolated outer conductors and illustrates the alignment for attachment to a socket array and stepped height of the socket inner and outer connectors.
Figure 3C:
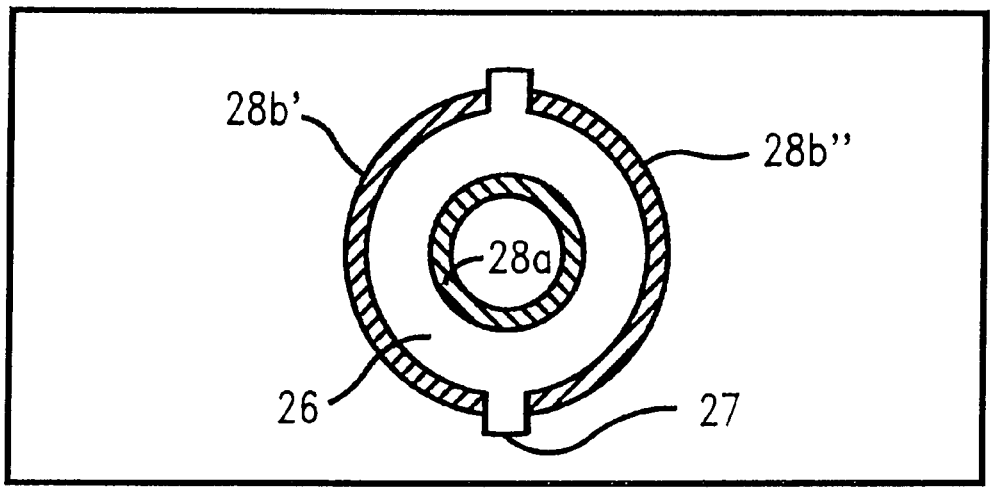
FIG. 3c is a top view of a coaxial connector with ribs on the outer surface.

FIG. 3b depicts the top view of a coaxial connector with multiple conductors on the outer surface. The coaxial connector can be made by selectively plating opposite sides of the outer surface of the length of an outer conductor while leaving an unplated strip or rib 27 between the plating surfaces. The tube with ribs 27 could be produced, for example, by an extrusion manufacturing process. The ribs 27 could define a nonconductive region between the exterior metallized surfaces 28b',28b", as shown in FIG. 3c, and act to electrically isolate conductive areas. The ribs 27 also can assist in the alignment of the connectors into fixtures used for attaching the connectors to the substrate.

Figure 3D:
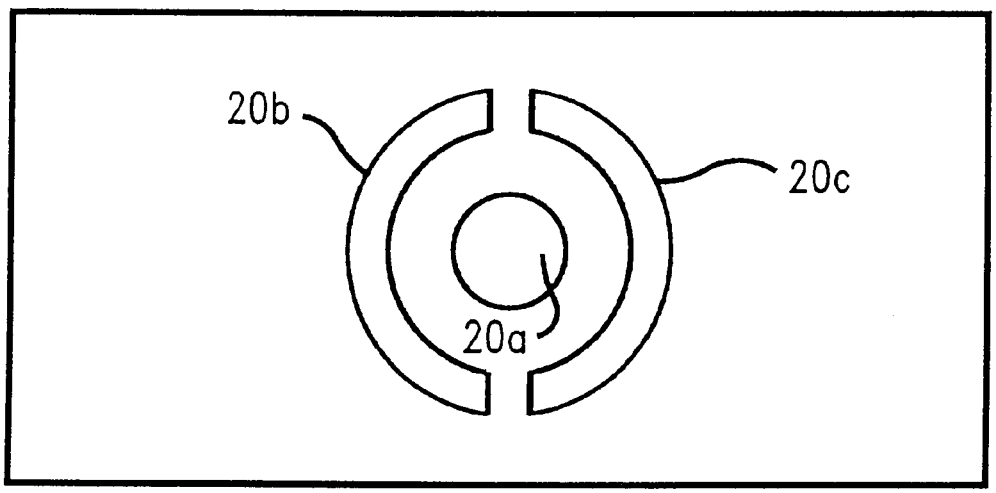
FIG. 3d illustrates the IO pad configuration on the substrate.

FIG. 3d illustrates the configuration of IO surface pads or coaxial electrical pads 20a,b,c that would be used to make contact to the coaxial connector of FIG. 3b with two outer conductors 28b' and 28b".

Figure 3E:
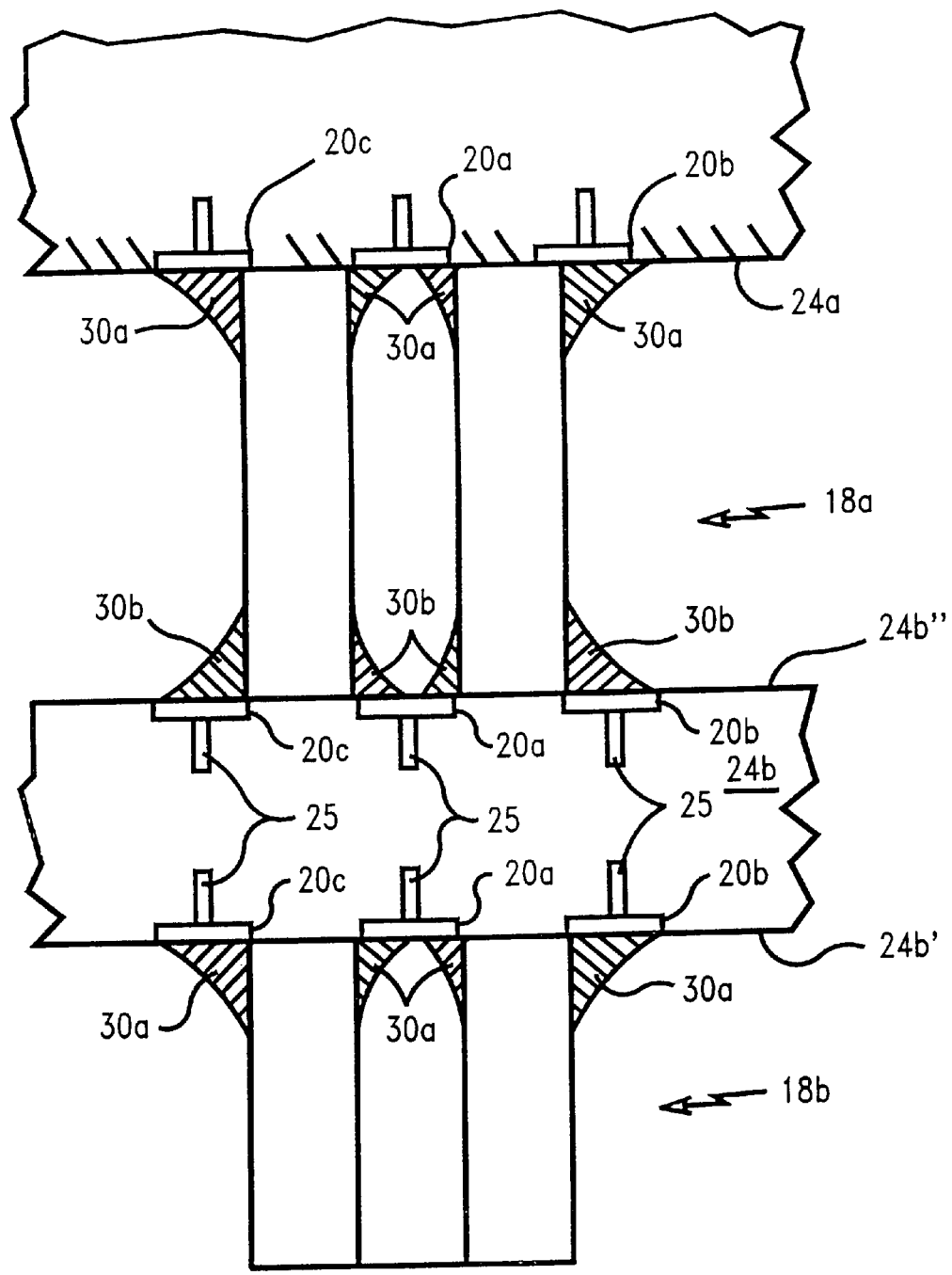
FIG. 3e is a cross sectional view illustrating the attachment of a coaxial connector to another substrate using a solder attachment process.

FIG. 3e illustrates the attachment of a coaxial connector 18a to a first substrate 24a and the attachment of a second coaxial connector 18b to a first side 24b' of substrate 24b by solder fillets 30a. The first coaxial connector 18a is then connected to a second side 24b" of the substrate 24b by solder fillets 30b. Alternately, the coaxial connectors 18a,b may be connected to a PC board 46 in place of the substrate 24b. The solders chosen for fillets 30a,b should provide an attachment hierarchy such that the solder used for attachment at fillet 30a would have a higher joining temperature than the solder used for attachment at fillet 30b. The joining hierarchy prevents solder fillet 30a from becoming soft during the attachment of fillet 30b which could cause misalignment of the connector 18a with the substrate 24a. The connector 18b may be connected to a socket, a PC board or another substrate. The stacking connection illustrated in this embodiment may be used to stack a plurality of packages or substrates and is limited by the spectrum of solder available to provide the proper joining hierarchy for the interconnections. Electrically conductive epoxies may be used in place of solder. Although the epoxies do not require thermal hierarchy, increase the difficulty of rework if a component should fail since the epoxy connection cannot be easily undone.

Figure 4A:
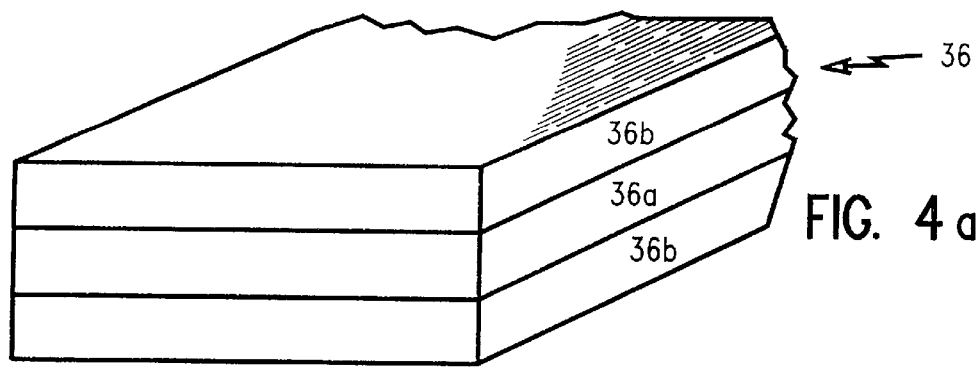
FIGS. 4a–f illustrate the steps for producing an integrated array of coaxial connectors from a dielectric sheet.
Figure 4B:
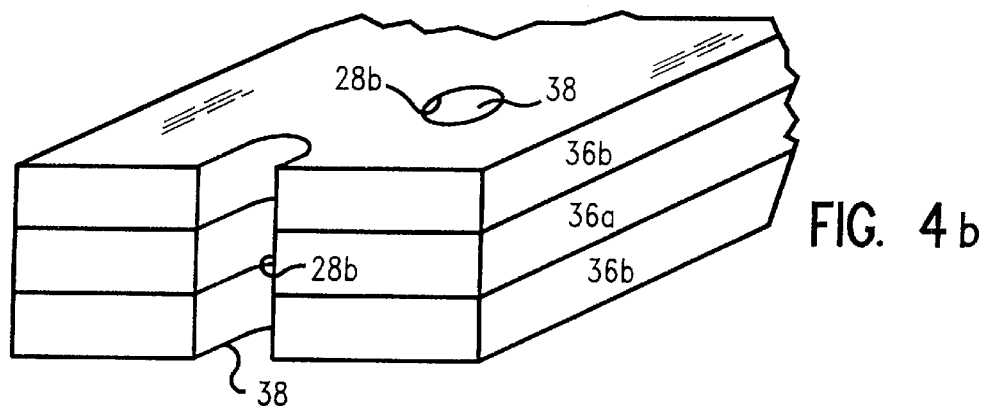
Figure 4C:
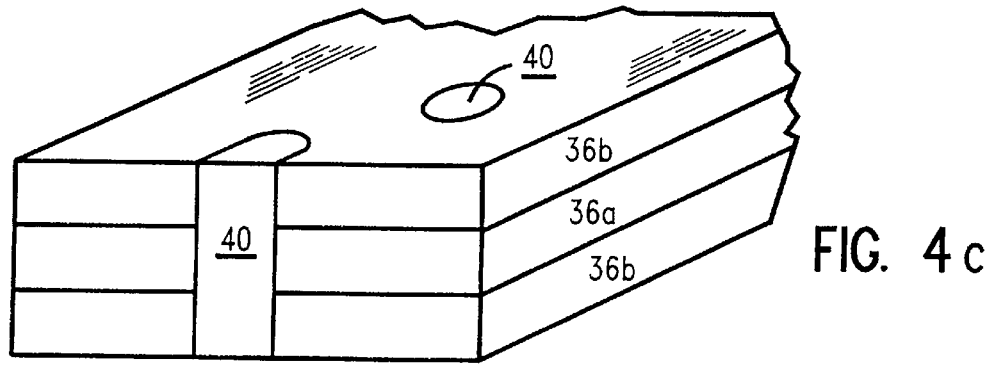
Figure 4D:
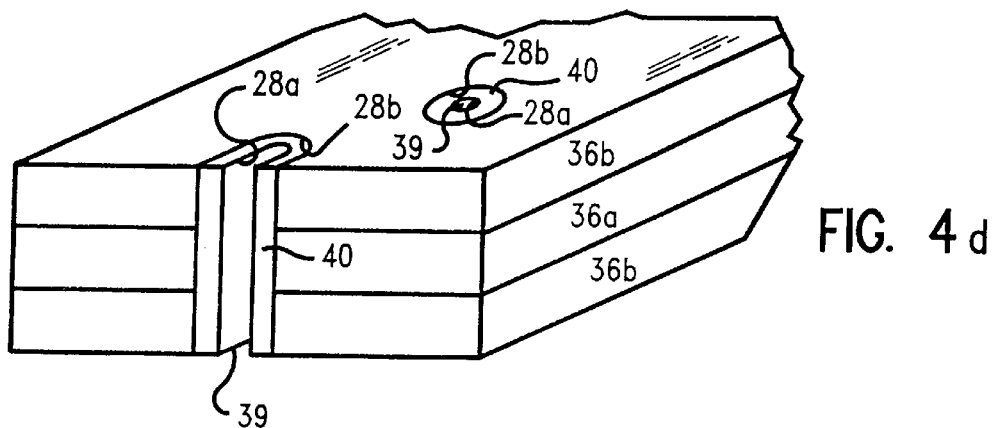
Figure 4E:
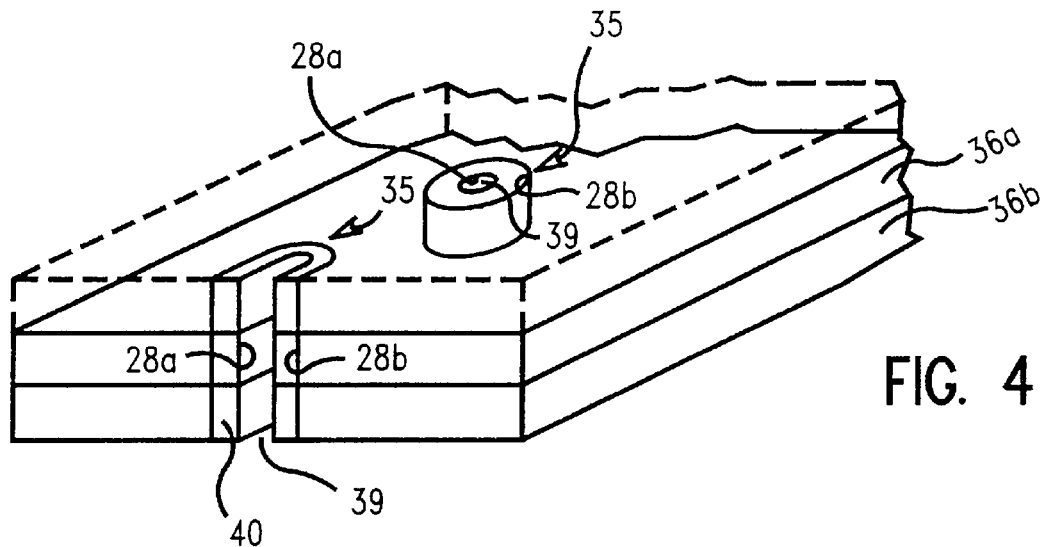
Figure 4F:
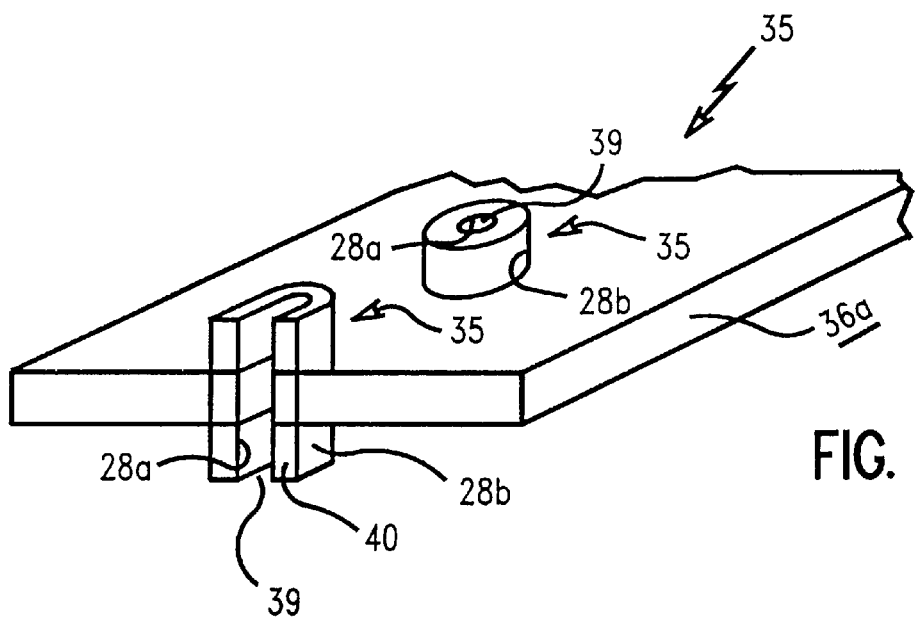

A coaxial connector, alternately, may be formed integrally in a dielectric sheet. FIGS. 4a–f illustrate the steps of producing an integrated coaxial connector 35. The process begins with a trilayer dielectric sheet 36 illustrated in FIG. 4a. The trilayer dielectric sheet 36 has an inner layer 36a and two outer layers 36b, the outer layers 36b are formed of a material which is more easily removable than the inner layer 36a and is removed using a chemical or etching process. As illustrated in FIG. 4b at least one hole 38 is formed in the sheet 36, depending upon the number of connectors desired. The hole 38 may be formed by punching or drilling or any suitable method. The walls of the holes 38 are then metallized by a seeding process and subsequent plating process as is typically practiced for metallizing through-holes in PC boards. The metallization forms the outer conductor 28b for the coaxial connector 35. Next, in FIG. 4c, the plated hole 38 is filled with filler dielectric 40 using a screening, extrusion or hot lamination process. The filler dielectric can be a liquid crystal polymer or polyimide which is commercially available from Hoechst Calanese Corp. of New Jersey and can be chosen by one skilled in the art without undue experimentation. The filler dielectric 40 should have good adherence to the dielectric material 40 of inner layer 36a and the plated metal of outer conductor 28b and a resistance to chemical etching removal similar to the etching resistance of the dielectric material of inner layer 36a. In FIG. 4d, a center hole 39 is formed in the dielectric 40 and thereafter the walls of the hole 39 are metallized by plating to form an inner conductor 28a of the coaxial connect 35. In order to form a coaxial connector 35 which protrudes from the inner layer 36a of the dielectric sheet 36, the outer layers 36b are next removed, as illustrated in FIGS. 4e–f, preferably by chemical etching in a solvent or process which will not effect the dielectric layer 36a or the filler dielectric 40. These chemical, etching, plating and metallization processes referred to above can be performed by one of ordinary skill in the art without undue experimentation. The process produces a coaxial connector 35 which extends from the inner dielectric 36a at a length which corresponds to the initial thickness of the outer dielectric 36b.

Although FIGS. 4a–f depict a single coaxial connector, multiple connectors may be formed by the process to produce an array of coaxial connector which are in alignment for improved connectability to a substrate or PC board.

Figure 5A:
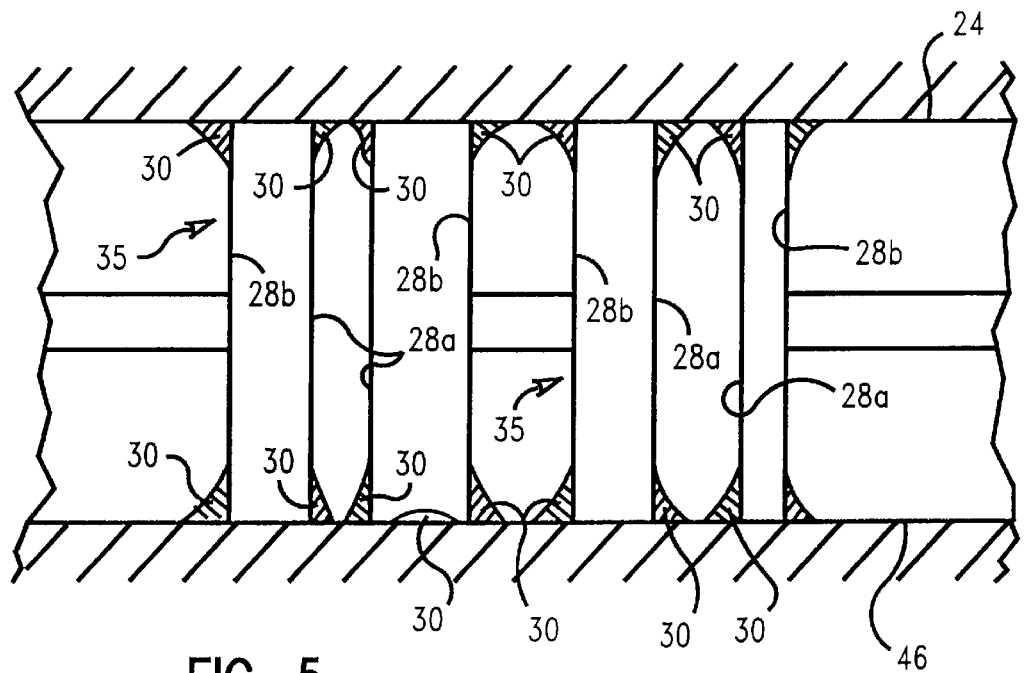
FIG. 5a is a cross-sectional view of a coaxial connector array of FIG. 4f at room temperature, attached at one end to a PC board and at another end to a substrate.
Figure 5B:
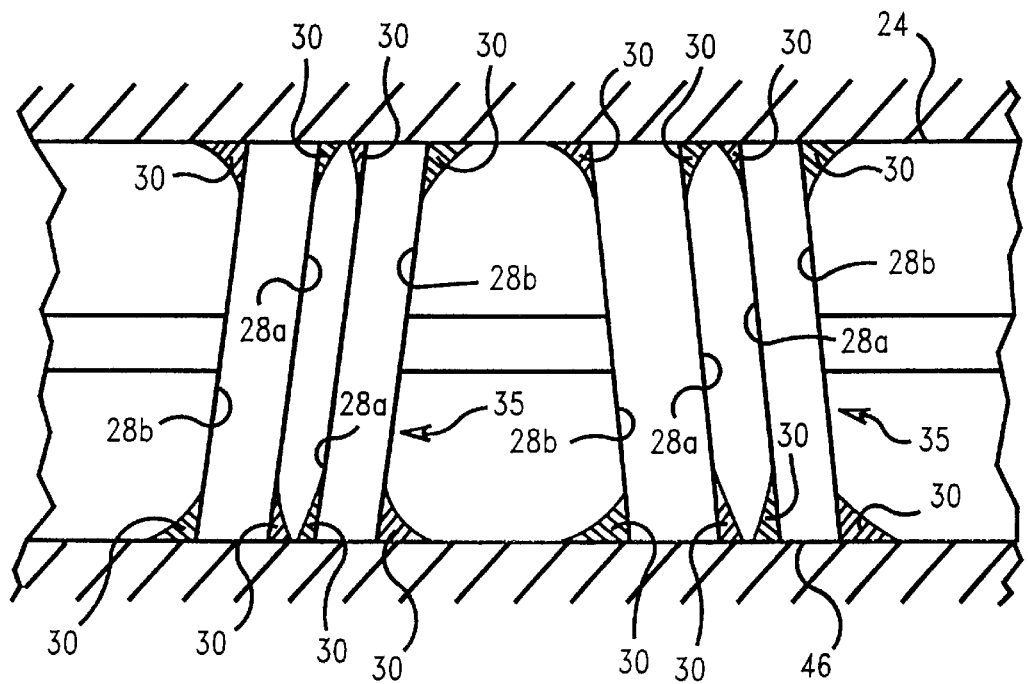
FIG. 5b is a cross-sectional view of a coaxial connector array of FIG. 5a at a temperature above room temperature, illustrating the absorption of mechanical forces by the coaxial connectors which are the result of CTE mismatch.

FIGS. 5a–b illustrate the connection, by solder fillet, of the integrated coaxial connectors 35 of FIG. 4f, to a PC board 46 and a substrate 24. FIG. 5a illustrates the connection at room temperature while FIG. 5b illustrates the connection at a temperature elevated above room temperature such as might be encountered in operation. At elevated temperatures, the PC board 46 expands more than, for instance, a ceramic substrate 24, which could cause the coaxial connectors 35 to bend out and cantilever at the substrate-to-coaxial connection. The connectors farthest from the center of the substrate will see the greatest amount of bending and stressing of the fillets 30 at the coaxial-to-substrate connection. The strain experienced at the fillet 30 could result in cracking and ultimately connection failure. However, the dielectric sheet 36 absorbs much of the CTE mismatch between the substrate 24 and the PC board 46, thus minimizing the creation of cracks in the fillets 30.

The coaxial connector array 35 can also be used for socket applications in which the inner layer 36a will help to minimized the transfer of strain due to the coaxial connector bending from CTE mismatch between the substrate 24 and the socket 31.

The integral coaxial connector 35 may also be formed with commercially available microspring inner and outer conductors 44a,b. Preferably, the microsprings 44a,b should be gold plated to improve conductivity and tarnish resistance, although the use of a microspring without plating or with other metallic plating is possible. The microspring integral coaxial connectors 44a,b provide a highly compliant contact method for LGA pads which are held in contact with coaxial electrical pads on another substrate (not shown) or PC board (not shown). The compressed LGA connector or integral coaxial connector 35 is also suitable for high frequency applications since the contact method provides for low inductance noise by shielding the inner conductor 44a from extraneous signals over a short path length.

Figure 6A:
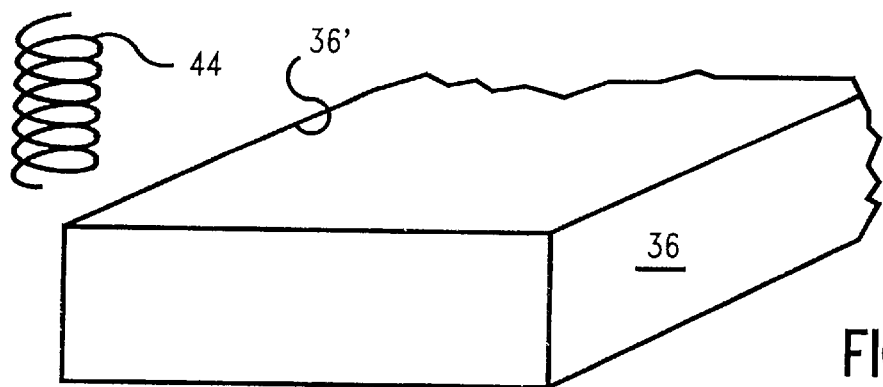
FIGS. 6a–f illustrate the steps for producing an integrated array of coaxial connectors from a dielectric sheet using conductive microsprings.
Figure 6B:
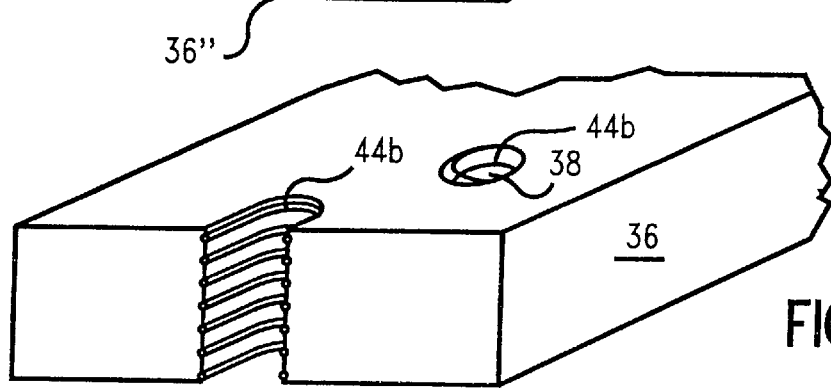
Figure 6C:
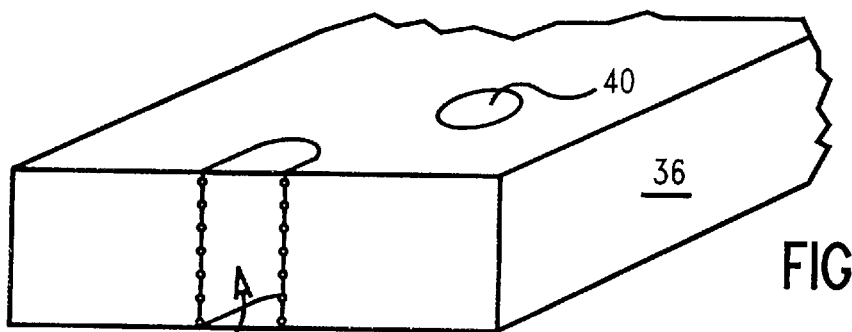
Figure 6D:
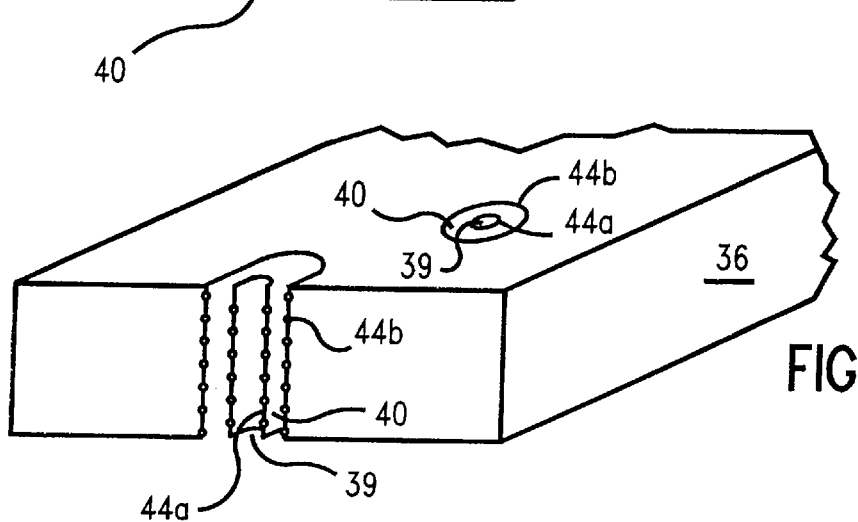
Figure 6E:
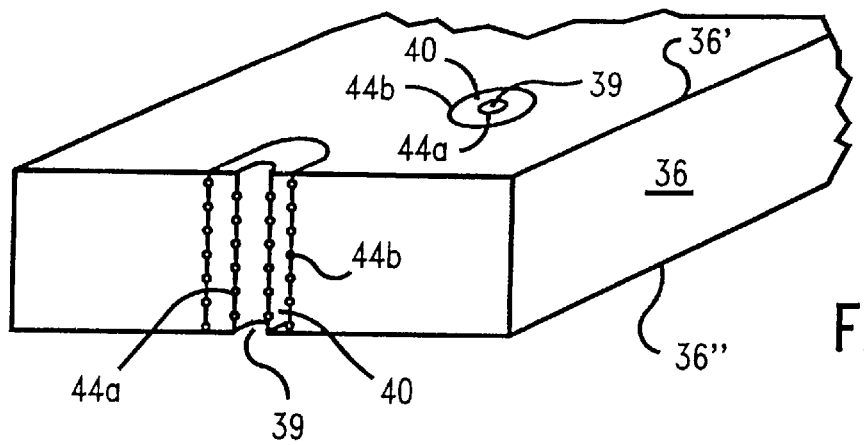
Figure 6F:
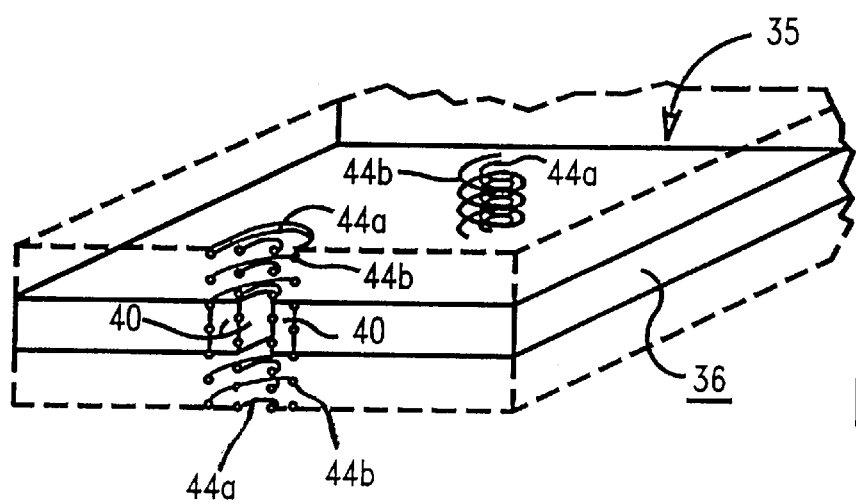

The alternate embodiment which uses microsprings is formed by a process which is illustrated in FIGS. 6a–f. The process comprising the following steps. First, a single composition or single layer dielectric sheet 36 with first side 36' and second side 36" is provided. Next, a hole 38 is formed in the dielectric sheet 36. A microspring shaped outer conductor 44b is fitted into the hole 38. The microspring 44b has an outside diameter which fits snugly into the hole 38 and is axially aligned with the hole 38. The hole 38 is filled with a filler dielectric 40 which embeds the microspring 44b into the hole 38 and adheres it to the sidewall of the dielectric sheet 36 as shown in FIG. 6c. The dielectric material 40 has a chemical etch rate similar to the etch rate of the dielectric sheet 36. Next, a hole 39, which is smaller in radius than the previously formed hole, is formed in the filler dielectric 40. The hole 39 is axially aligned with the outer microspring 44b. A microspring inner conductor 44a is next fitted into the hole 39. The inner microspring 44a has an outside diameter which fits snugly into the hole 39 and is axially aligned with the hole 39. The hole 39 is then filled with filler dielectric 40. Next, the first and second surfaces, 36' and 36", of the dielectric sheet 36 and the filler dielectric 40 are removed such that the microspring conductors 44a,b are exposed and protrude from the dielectric sheet 36. The removal is achieved by chemical etching which could be performed by one of ordinary skill in the art without undue experimentation. The degree of etching of dielectric sheet 36 and filler 40 define the extent to which microsprings 44a,b protrude from the dielectric sheet 36 and thereby define the level of compression which will be provided by the microsprings when used for joining LGA connections.

Figure 7:
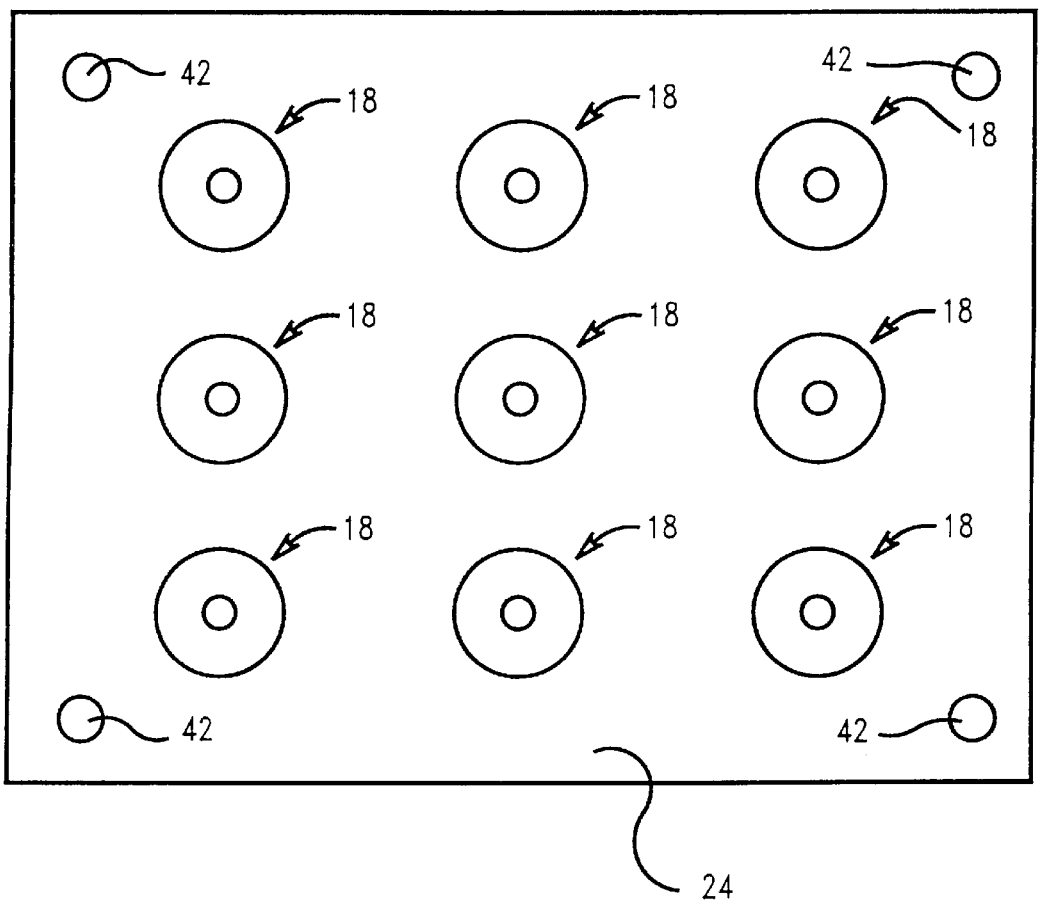
FIG. 7 illustrates an IC package with a substrate and a combination of coaxial connectors and PGA connectors.

FIG. 7 illustrates an electronic package which comprises an electronic substrate 24, a plurality of coaxial connectors 18 attached to the substrate 24, and a plurality of pin connectors 42 such as Pin-Grid-Array (PGA) connectors, attached to the substrate 24. The package may also include a socket attached to a PC board. The socket as described above, could be configured for mating with the coaxial connectors 18 and pins 42. The pins 42 which can be electrically isolated from the electronic substrate 24 are positioned for guiding the coaxial connectors 18 into alignment with the mating contacts in the sockets. Alternately, the pins 42 could be electrically connected to vias in the substrate 24. The electrical connection of the pins 42 to the substrate 24 may be accomplished by any well known method by one skilled in the art without undue experimentation. A common attachment method is by solder.

The present invention coaxial connector is designed with an electrically insulating cylindrical or other shaped dielectric, coated with electrically conducting material on the interior and exterior surfaces which are electrically isolated from each other. Further, the present invention at least doubles the IO capacity of the PGA type pin design. Also, the invention presents a coaxial socket that enables the advantages of the connector to be fully utilized at frequencies that extend into the GHz range. Further, the invention provides a method of solder attachment of the connector in a stacked configuration to provide a high density, three-dimensional stacked IC package. Further, the invention presents methods by which the coaxial connectors can be mass produced and attached to packages. Also, using similar forming mechanisms a structure can be produced that can be used for compliant interconnection of Land Grid Array (LGA) pad devices with high frequency isolation.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electronic interconnect device for attachment to an electronic package comprising:

a coaxial connector comprising a dielectric material having a center opening and isolated electrically conductive interior and exterior surfaces, said coaxial connector having first and second ends, said first end for attachment to said electronic package; and, a socket for mating with said coaxial connector second end comprising a body and inner and outer conductors housed in said body and configured for mating with said coaxial connector such that said inner and outer conductors do not traverse beyond said coaxially cylindrical first end, said inner conductor adapted to be received within said electrically conductive interior surface of said coaxial connector, said inner and outer conductors configured so as to respectively contact said interior and exterior surfaces of said coaxial connector at different times in order to reduce the maximum insertion force of said coaxial connector into said socket.

2. An electronic package and interconnect device for attachment to said electronic package comprising:

a coaxial connector comprising a dielectric material having a center opening and isolated electrically conductive interior and exterior surfaces, said coaxial connector having first and second ends, said first end for attachment to said electronic package;

said electronic package including a substrate having coaxial electrical pads attached thereon, said coaxial connector positioned on said pads and attached to said pads on said substrate; and, a socket attached to a PC board, said socket comprising a body and inner and outer conductors housed in said body and configured for mating with said coaxial connector such that said inner and outer conductors do not traverse into said substrate, said inner conductor adapted to be received within said electrically conductive interior surface of said coaxial connector, said inner and outer conductors configured so as to respectively contact said interior and exterior surfaces of said coaxial connector at different times in order to reduce the maximum insertion force of said coaxial connector into said socket.

* * * * *

UNITED STATES PATENT AND TRADEMARK OFFICE
CERTIFICATE OF CORRECTION

PATENT NO. : 6,086,383
DATED : July 11, 2000
INVENTOR(S) : B. Fasano et al.

It is certified that error appears in the above-identified patent and that said Letters Patent is hereby corrected as shown below:

In column 1, line 26, delete "attach" and substitute therefor -- attachment --.

In column 3, line 61, after "relates" insert -- to --.

In column 4, line 13, after "end" insert -- is --.

In column 4, line 56, delete " cross sectional " and substitute therefor -- cross-sectional --.

In column 9, line 1, delete "connector" and substitute therefor -- connectors --.

Signed and Sealed this

Third Day of April, 2001

Attest:

NICHOLAS P. GODICI

Attesting Officer     Acting Director of the United States Patent and Trademark Office